US 11,849,514 B1

United States Patent
Montoncelli et al.

(10) Patent No.: US 11,849,514 B1
(45) Date of Patent: Dec. 19, 2023

(54) CURRENT REGULATOR CIRCUITS WITH SELF-ADAPTIVE POWER OFFLOADING

(71) Applicant: Infineon Technologies AG, Neubiberg (DE)

(72) Inventors: Mattia Montoncelli, Abano Terme (IT); Maurizio Galvano, Padua (IT); Christos Konstantopoulos, Padua (IT); Roberto Penzo, Vigonza (IT); Enrico Tonazzo, Villanova di Camposampiero (IT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/806,396

(22) Filed: Jun. 10, 2022

(51) Int. Cl.
| | |
|---|---|
| *H05B 45/30* | (2020.01) |
| *H05B 45/40* | (2020.01) |
| *G01R 19/00* | (2006.01) |
| *G05F 1/56* | (2006.01) |
| *B60R 16/03* | (2006.01) |
| *H05B 45/355* | (2020.01) |
| *H05B 45/35* | (2020.01) |

(52) U.S. Cl.
CPC ............. *H05B 45/30* (2020.01); *B60R 16/03* (2013.01); *G01R 19/0092* (2013.01); *G05F 1/56* (2013.01); *H05B 45/35* (2020.01); *H05B 45/355* (2020.01); *H05B 45/40* (2020.01)

(58) Field of Classification Search
CPC ........ H05B 45/10; H05B 45/30; H05B 45/50; H05B 45/325; H05B 45/345; H05B 45/355; H05B 45/395
See application file for complete search history.

(56) References Cited

U.S. PATENT DOCUMENTS

| | | | |
|---|---|---|---|
| 3,400,081 A1 | 3/2013 | Catalano et al. | |
| 8,963,431 B2 | 2/2015 | van den Berg et al. | |
| 9,468,051 B1 | 10/2016 | Lin et al. | |
| 9,781,788 B1 | 10/2017 | Cortigiani et al. | |
| 9,835,668 B2* | 12/2017 | Kriebernegg | G01R 31/2635 |
| 10,136,496 B2 | 11/2018 | Sudhaus | |
| 10,187,955 B2* | 1/2019 | Pamato | H05B 45/46 |
| 10,542,593 B1* | 1/2020 | Mignoli | H05B 45/54 |
| 11,523,484 B2 | 12/2022 | Mignoli et al. | |
| 2007/0188425 A1 | 8/2007 | Saccomanno | |
| 2007/0257645 A1 | 11/2007 | Nishino | |

(Continued)

FOREIGN PATENT DOCUMENTS

WO 2012063141 A1 5/2012

OTHER PUBLICATIONS

"Infineon® LITIX™ Basic Driver Family, Multichannel Solutions for N-1, Open Load & Short Circuit Detection," Infineon, Application Note, Automotive Power, V1.1, Mar. 27, 2015, 65 pp.

*Primary Examiner* — Tung X Le
(74) *Attorney, Agent, or Firm* — Shumaker & Sieffert, P.A.

(57) ABSTRACT

A circuit may be configured to deliver current to one or more light emitting diodes (LEDs). The circuit may comprise a first current path configured to deliver a first current to the one or more LEDs, and a second current path in parallel with the first current path, wherein the second current path is configured to deliver a second current through a voltage drop element and to the one or more LEDs. According to this disclosure, a sum of the first current and the second current is regulated based on a sensed current through the circuit.

20 Claims, 9 Drawing Sheets

(56) References Cited

U.S. PATENT DOCUMENTS

| | | |
|---|---|---|
| 2010/0207543 A1 | 8/2010 | Crawford et al. |
| 2010/0315019 A1 | 12/2010 | Hoogzaad et al. |
| 2011/0199003 A1 | 8/2011 | Muguruma et al. |
| 2012/0181931 A1* | 7/2012 | Katsura .............. G01R 31/2635 |
| | | 315/77 |
| 2013/0082602 A1* | 4/2013 | Bradford ................ H05B 45/58 |
| | | 315/122 |
| 2013/0088174 A1 | 4/2013 | Yagi et al. |
| 2013/0127353 A1 | 5/2013 | Athalye et al. |
| 2013/0257279 A1 | 10/2013 | Le |
| 2014/0241387 A1* | 8/2014 | Ortiz .................... H01S 3/0912 |
| | | 372/38.02 |
| 2015/0022112 A1 | 1/2015 | Nietfeld |
| 2015/0245433 A1 | 8/2015 | McCune, Jr. |
| 2016/0044757 A1* | 2/2016 | Koo ....................... H05B 45/50 |
| | | 315/297 |
| 2016/0205742 A1* | 7/2016 | Seki ....................... H05B 45/46 |
| | | 315/122 |
| 2017/0367155 A1 | 12/2017 | Cortigiani et al. |
| 2018/0054870 A1* | 2/2018 | Yanagizu ........... H05B 45/3725 |
| 2018/0352622 A1* | 12/2018 | Ng ......................... H05B 45/46 |
| 2019/0364625 A1* | 11/2019 | Brower .................. G05F 1/577 |

\* cited by examiner

REGULATE A FIRST CURRENT PATH OF A CURRENT REGULATOR TO ONE OR MORE LEDS BASED ON A SENSED CURRENT, WHEREIN THE SENSED CURRENT COMPRISES A SUM OF CURRENTS ASSOCIATED WITH THE FIRST CURRENT PATH AND A SECOND CURRENT PATH ⸺ 901

REGULATE THE SECOND CURRENT PATH OF THE CURRENT REGULATOR TO THE ONE OR MORE LEDS BASED ON THE SENSED CURRENT, WHEREIN THE SECOND CURRENT PATH IS IN PARALLEL WITH THE FIRST CURRENT PATH, AND WHEREIN THE SECOND CURRENT PATH IS CONFIGURED TO PASS THROUGH A DROP ELEMENT TO REDUCE POWER DISSIPATION WITHIN THE CURRENT REGULATOR ⸺ 902

FIG. 9

CURRENT REGULATOR CIRCUITS WITH SELF-ADAPTIVE POWER OFFLOADING

TECHNICAL FIELD

This disclosure relates to current regulator circuits, such as current regulators used for driving and controlling light emitting diodes (LEDs) within a vehicle or a similar setting.

BACKGROUND

Driver circuits are often used to control a voltage, current, or power at a load. For instance, a light emitting diode (LED) driver circuit may control the power supplied to one or more light emitting diodes.

Some LED driver circuits comprise linear current regulators that are configured to regulate the amount of current supplied to LEDs. In such circuits, it may be desirable to reduce the power dissipated within the circuit in order to help avoid overheating, especially when a power supply voltage to the circuit changes, i.e., increases.

SUMMARY

This disclosure is directed to circuits and techniques for controlling light emitting diodes (LEDs). The described circuits may comprise two or more separate current paths arranged in parallel, for delivering first and second currents to one or more LEDs. However, rather than monitoring the first and second currents individually in the two separate current paths, the circuit is configured to regulate a sum of the first current and the second current based on a sensed current through the circuit. For example, the circuit may be configured to generate a main control signal for regulating the first current path based on the sensed current, and the circuit may be further configured to generate a second control signal (based on the main control signal) for regulating the second current path. For example, in some cases, the main control signal may comprise a first control signal for controlling a first transistor, and a second control signal for controlling a second transistor may be defined as a function of the main control signal.

In one example, this disclosure describes a circuit configured to deliver current to one or more LEDs. The circuit may comprise a first current path configured to deliver a first current to the one or more LEDs, and a second current path in parallel with the first current path, wherein the second current path is configured to deliver a second current through a voltage drop element and to the one or more LEDs, wherein a sum of the first current and the second current is regulated based on a sensed current through the circuit.

In another example, this disclosure describes a method of operating a current regulator circuit for driving one or more LEDs. The method may comprise regulating a first current path through the current regulator circuit based on a sensed current through the current regulator circuit, wherein the first current path is configured to deliver a first portion of output current to the one or more LEDs based on a sensed current through the current regulator circuit, and regulating a second current path through the current regulator circuit based on the sensed current through the current regulator circuit, wherein the second current path is in parallel with the first current path, wherein the second current path is configured to deliver a second portion of the output current to the one or more light emitting diodes, wherein the sensed current through the current regulator circuit comprises a sum of the first portion of output current and the second portion of output current, and wherein the second portion of the current is further configured to pass through a drop element to reduce power dissipation within the current regulator circuit.

Details of these and other examples are set forth in the accompanying drawings and the description below. Other features, objects, and advantages will be apparent from the description and drawings, and from the claims.

BRIEF DESCRIPTION OF DRAWINGS

FIG. 9 is an example flow diagram showing one or more aspects of this disclosure.

DETAILED DESCRIPTION

Figure 1:
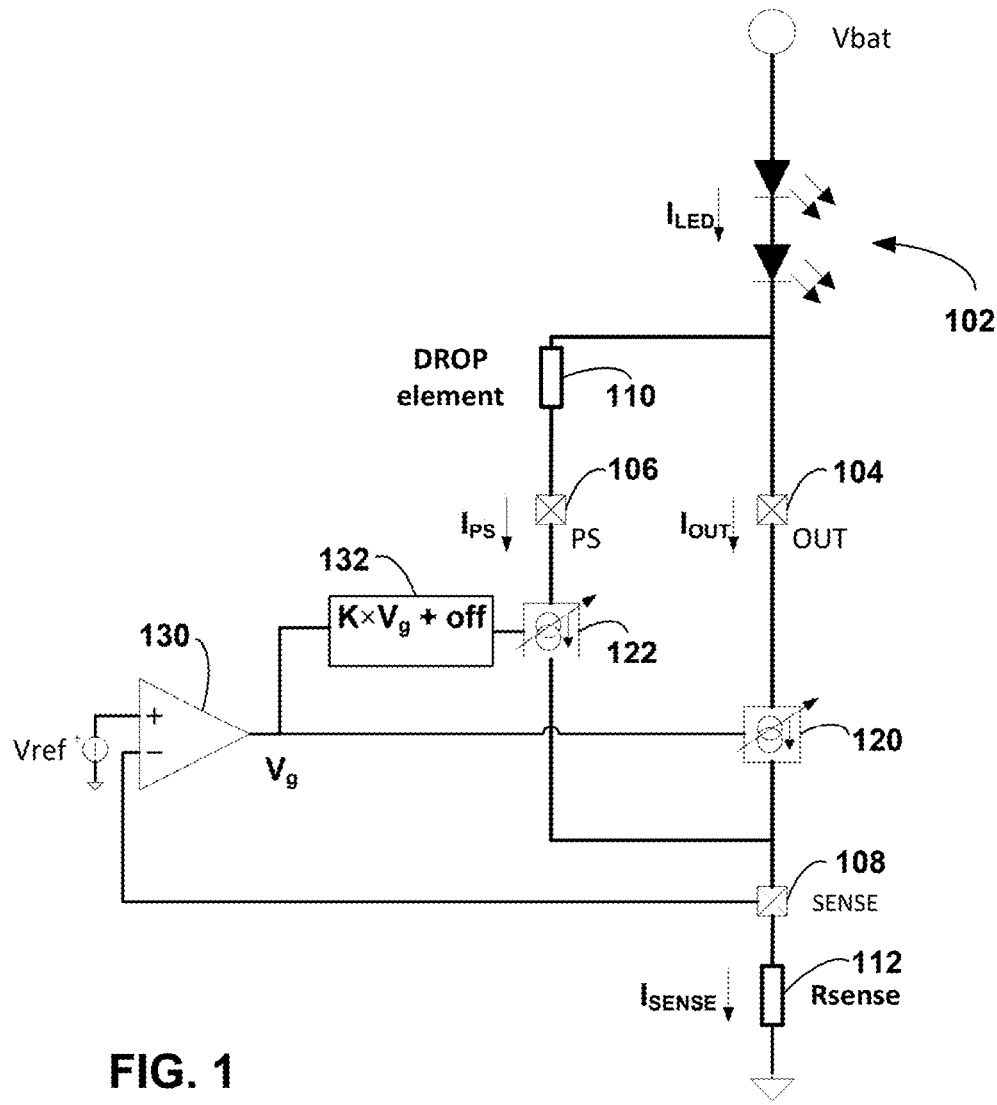
FIG. 1 is a circuit diagram of a system that includes a current regulator circuit configured to control one or more light emitting diodes (LEDs) consistent with the teachings of this disclosure.

This disclosure is directed to circuits and techniques for regulating current to light emitting diodes (LEDs), such as in a vehicle or another setting. The circuits and techniques may be used to control interior LEDs of a vehicle, but in other examples, the circuits and techniques may be used for exterior lights, interior lights, vehicle headlamps, or any type of vehicle lighting that uses LEDs. Moreover, although described for vehicle settings, the described circuits and techniques for controlling LEDs can also be used in any other setting where LEDs are used.

In general, driver circuits may control the amount of power provided to loads from power sources. In automotive applications, as one example, the power supply may vary within an operating voltage range of approximately 8 volts to 18 volts. The power dissipated by the driver, which is proportional to its voltage drop, may negatively impact the functionality of the driver circuit, such as in situations where the junction temperature exceeds a certain threshold (e.g., 150° C.).

Some solutions for linear current regulators may try to reduce the amount of power dissipated in a driver circuit by using one or more passive elements in series with the load. However, with additional passive elements in series with the load, the driver performances (e.g., regulation stability) may degrade in some worst-case conditions, such as during low battery levels or when using a long wire harness for an output connection.

Another possible solution is to use several driver circuits in parallel with the main driver circuit. This parallelization method may help to reduce the amount of power dissipated in a driver circuit by reducing the current flowing through the driver proportionally to the number of additional driver circuits in parallel. Additional driver circuits, however, can add substantial circuit costs, which are undesirable.

In still other cases, the amount of power dissipated in a driver circuit may be reduced by adding a DC/DC regulator, e.g., between the variable supply source and the driver circuit. Driver parallelization and DC/DC regulator techniques, however, may not be cost effective. Indeed, the additional active components needed for driver parallelization and DC/DC regulator techniques may be cost prohibitive or undesirable from a cost standpoint.

Yet another approach to reduce the dissipated power in the LED driver may be the use of one or more low-cost external element placed in parallel with a driver device. An additional control loop to monitor current, voltage, or power over the external element(s), however, may present challenges and increase circuit costs.

According to this disclosure, in order to reduce the LED driver design complexity with a consequent silicon area saving, a "self-adaptive" power offloading concept has been designed, as described herein. One advantage of the techniques of this disclosure relative to other power dissipation techniques is the potential elimination of additional measurements for sensing and defining the power distribution between the two paths. Instead, according to this disclosure, an LED driver control loop may only perform overall load current regulation, while the power distribution ratio can be dynamically defined by the system boundary conditions.

Figure 3:
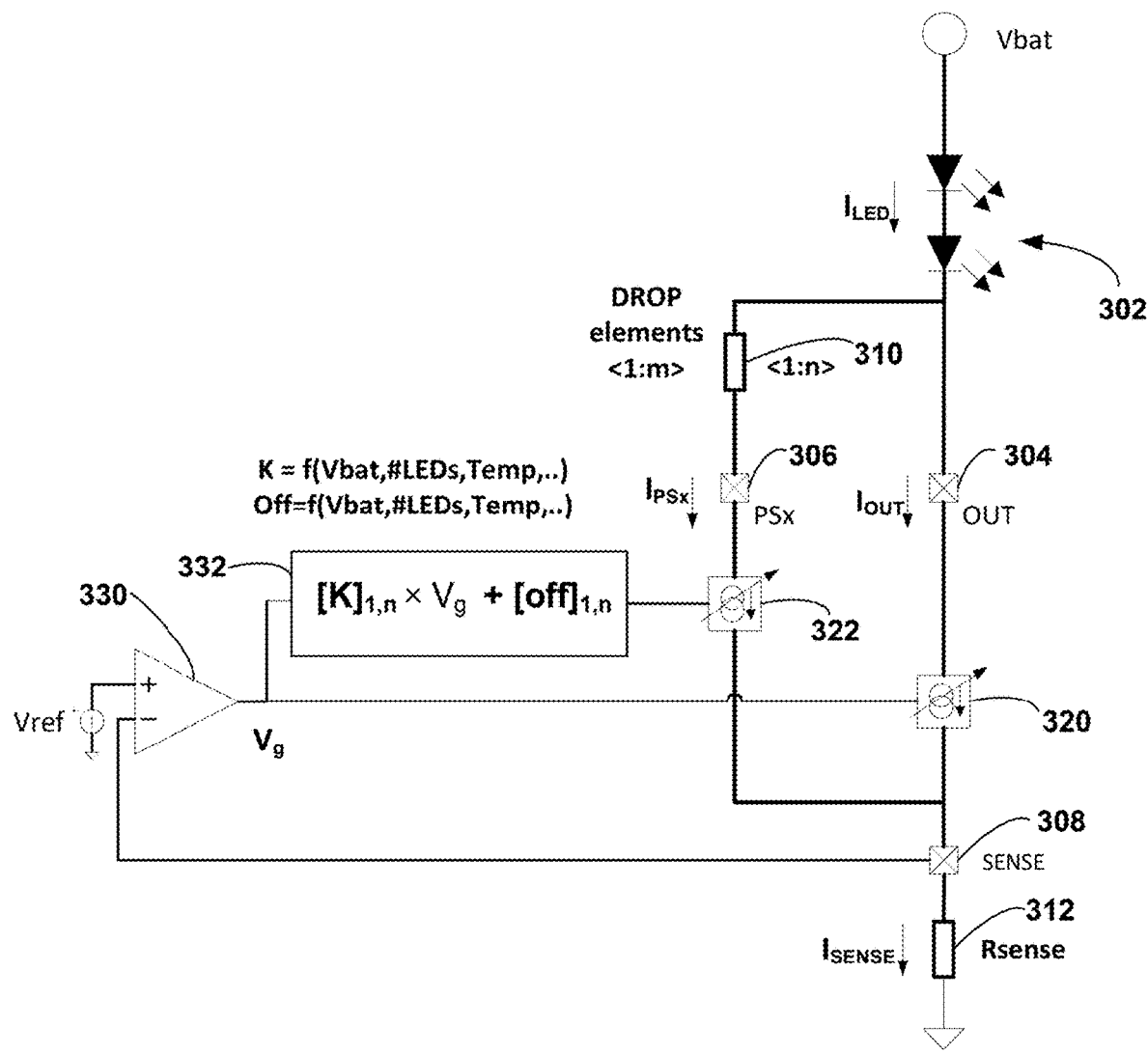
FIG. 3 is another circuit diagram of a system that includes a current regulator circuit configured to control one or more LEDs consistent with the teachings of this disclosure.
Figure 4:
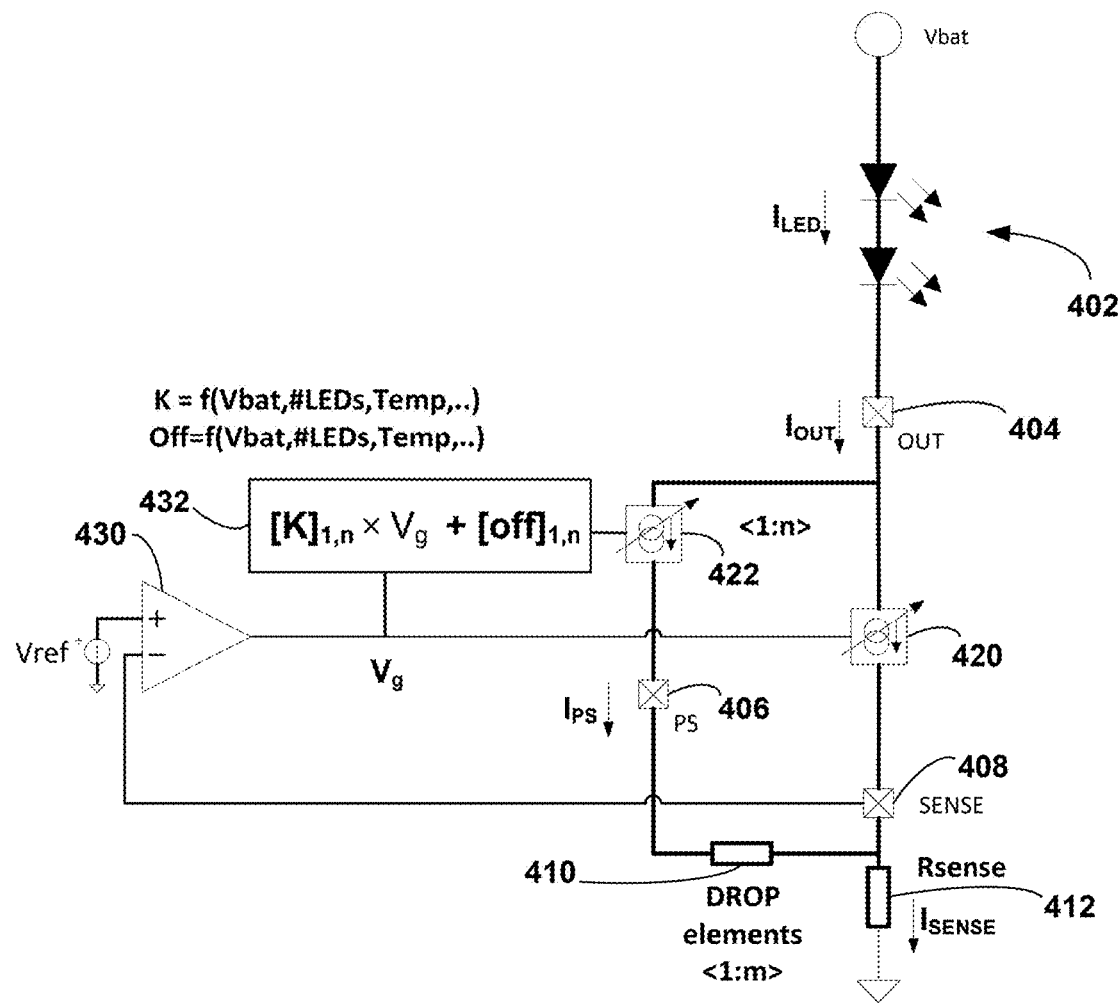
FIG. 4 is another circuit diagram of a system that includes a current regulator circuit configured to control one or more LEDs consistent with the teachings of this disclosure.
Figure 5:
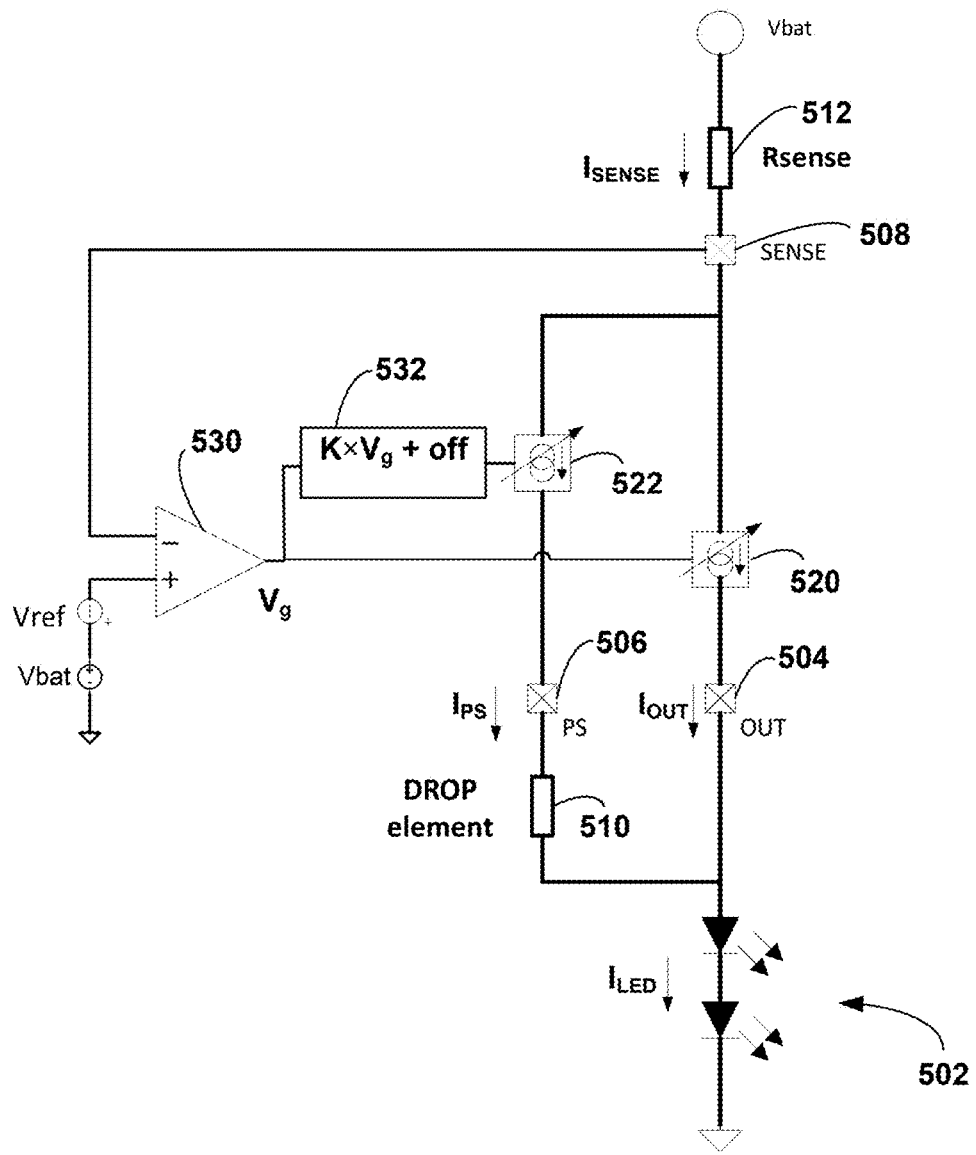
FIG. 5 is another circuit diagram of a system that includes a current regulator circuit configured to control one or more LEDs consistent with the teachings of this disclosure.
Figure 6:
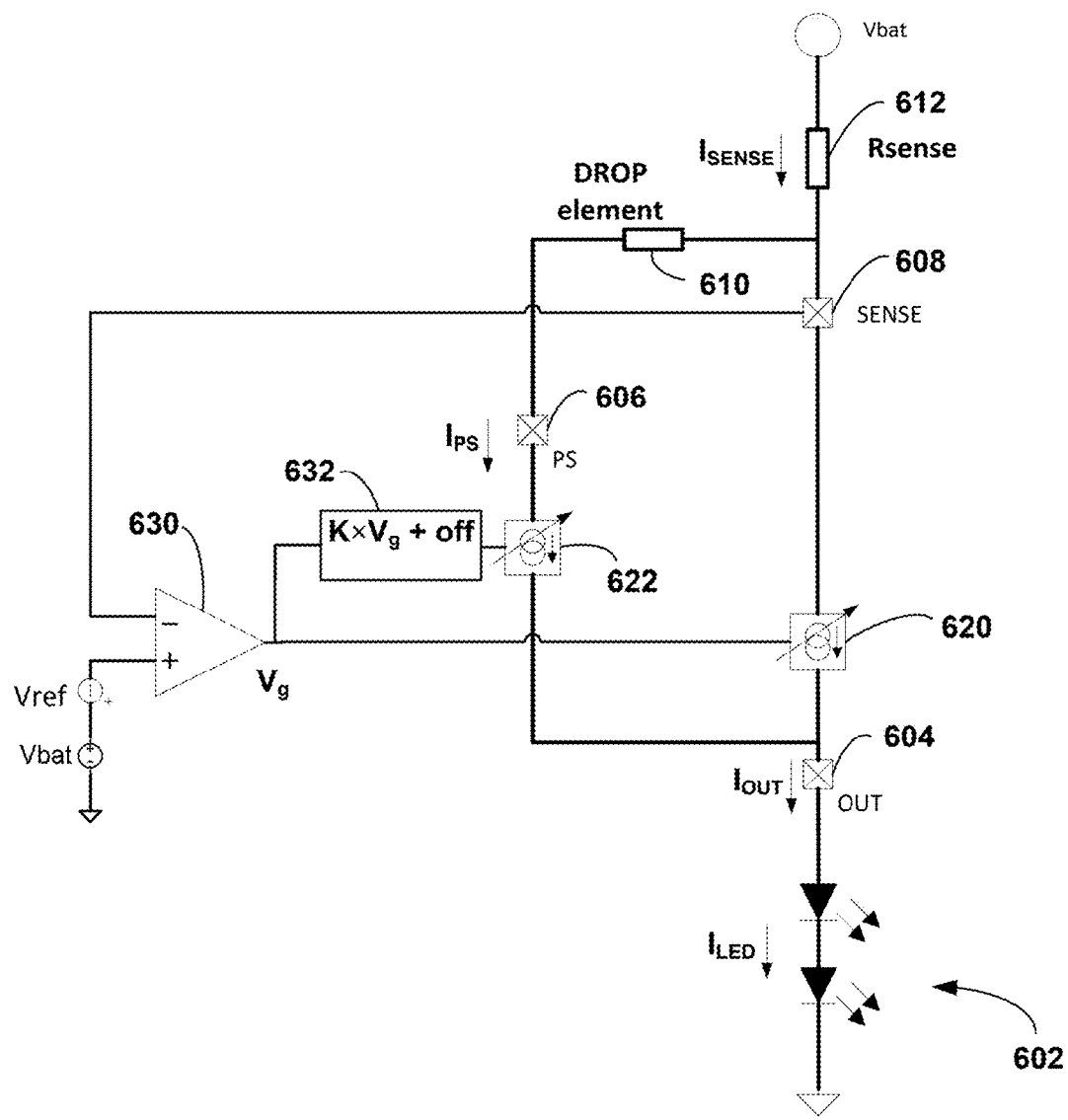
FIG. 6 is another circuit diagram of a system that includes a current regulator circuit configured to control one or more LEDs consistent with the teachings of this disclosure.

The self-adaptive power offloading concept is shown in several examples set forth in FIGS. 1-6, which are discussed below. The various circuits of FIGS. 1-6 are similar in many respects, but show various elements, e.g., elements that are external to the circuits, positioned in different locations and on different supply sides or supply pins. Various externals elements, such as the LEDs, drop elements, sense resistors, or other elements, may be positioned on a high side associated with a first supply (e.g., a battery) and a low side associated with a second supply (e.g., a ground). For example, LEDs can be connected to the high side or the low side of a circuit, consistent with the techniques of this disclosure. FIGS. 1, 2, 5, and 6 show examples with two current paths in the driver circuit, while FIGS. 3 and 4 demonstrate that any number of current paths (N) may be used consistent with this disclosure. The examples of FIGS. 3 and 4 show LEDs positioned on a high side, but the features and principles shown in FIGS. 3 and 4 can also be extended to examples where the LEDs are positioned on the low side as shown in FIGS. 5 and 6. The high side and the low side may be associated with a battery potential and ground potential, in some examples, but the principles of this disclosure could also apply with other types of supplies or other reference potentials.

As described in greater detail below, the circuits shown in FIGS. 1-6 may comprise two or more separate current paths arranged in parallel, for delivering first and second currents to one or more LEDs. However, rather than monitoring the first and second currents individually in the two separate current paths, the circuit is configured to regulate a sum of the first current and the second current based on a sensed current through the circuit. For example, the circuit may be configured to generate a main control signal for regulating the first current path based on the sensed current, and the circuit may be further configured to generate a second control signal (based on the main control signal) for regulating the second current path. For example, in some cases, the main control signal may comprise a first control signal for controlling a first transistor, and a second control signal for controlling a second transistor may be defined as a function of the main control signal. For example, the second control signal may comprise a signal generated by applying a gain to the main control signal, and in some cases, the gain may be defined based on circuit parameters such as the supply voltage, the number of LEDs being driven, temperature of the circuit, or other circuit parameters.

As shown in FIG. 1, a circuit may be configured to deliver current to one or more LEDs 102. The circuit may comprise a first current path configured to deliver a first current ($I_{OUT}$) to the one or more LEDs 102, and a second current path in parallel with the first current path, wherein the second current path is configured to deliver a second current ($I_{PS}$) through a voltage drop element 110 and to the one or more LEDs 102, wherein a sum of the first current and the second current is regulated based on a sensed current through the circuit. For example, a sense pin 108 may provide a sum of the first current and the second current to operational amplifier 130 to create a single control loop that is based on the sum of the first current ($I_{OUT}$) and the second current ($I_{PS}$). The single control loop can be regulated based on a reference voltage Vref provided to operational amplifier 130, and Vref may be fixed or programmable. Moreover, Vref can even be changed or adapted, e.g., to adjust light output by the LEDs, or create effects, to create modulation in the control signals, to provide analog dimming, or for other reasons.

Current sources 120 and 122 may comprise transistors, and the transistors of current sources 120 and 122 may define a high side associated with Vbat and a low side associated with a ground. The transistors that define current sources 120 and 122, for example, may each comprise a Field Effect Transistor (FET) or a bipolar junction transistor (BJT). Examples of FETs may include, but are not limited to, junction field-effect transistor (JFET), metal-oxide-semi-conductor FET (MOSFET), dual-gate MOSFET, insulated-gate bipolar transistor (IGBT), any other type of FET, or any combination of the same. Examples of MOSFETS may include, but are not limited to, PMOS, NMOS, DMOS, or any other type of MOSFET, or any combination of the same. MOSFETS may be formed in silicon or another semiconductor material such as gallium nitride (GaN) or silicon carbide (SiC), in which case the MOSFETS may be referred to as GaN MOSFETs or SiC MOSFETS. Examples of BJTs may include, but are not limited to, PNP, NPN, heterojunction, or any other type of BJT, or any combination of the same.

Consistent with FIG. 1, an output pin 104 may be positioned on a first supply side (e.g., a high side) of the first current path, wherein output pin 104 is configured to be connected to the one or more LEDs 102. A power pin 106 may be positioned on the first supply side of the second current path, wherein power pin 106 is configured to be connected to the voltage drop element 110 and wherein voltage drop element 110 is connected in series with the one or more LEDs 102. In some cases, power pin 106 may be referred to as a so-called power-shift pin. A current sense pin 108 may be positioned on a second supply side of the first current path and the second supply side of the second current path, wherein current sense pin 108 is configured to be connected to a current sense resistor 112.

Operational amplifier 130 may be configured to generate a main control signal for regulating the first current path and the second current path based on the sensed current ($I_{SENSE}$). In this case, the sensed current comprises a summation of the first current ($I_{OUT}$) and the second current ($I_{PS}$).

The first current path may include a first transistor, e.g., represented in FIG. 1 as current source 120. The second current path may include a second transistor, e.g., represented in FIG. 1 as current source 122. Again, the first and second transistors may comprise BJTs or FETs, such as MOSFETS, as mentioned above. The main control signal may correspond to Vg, which defines a first control signal for the first transistor associated with current source 120. Gain unit 132 of the circuit may be configured to generate a second control signal for the second transistor associated with current source 122. Moreover, the second control signal may be a function of the main control signal, e.g., the main control signal with a gain applied. The first and second control signals, for example, may comprise gate control signals for MOSFETs or control signals to be applied to the base node of BJTs.

The first current path and the second current path may be formed in the same semiconductor material. In other words, current source 120, operational amplifier 130, and current source 122 may be formed in a single integrated circuit on a semiconductor substrate. In some examples, gain unit 132 may be implemented via programmable inputs to define the operation of current source 122, whereby the programmable inputs define the gain (e.g., define a K factor and an offset).

In some examples, the second control signal is defined by an offset (off) added to a product of the main control signal (Vg) multiplied by a K factor. The K factor may be considered a linear gain applied relative to main control signal (Vg) and the offset (off) may be considered an offset gain that is further applied to the product of the main control signal multiplied by the K factor. In some examples, the K factor and the offset are each defined as a function of a supply voltage associated with the circuit. In some examples, the K factor and the offset are each defined as a function of a supply voltage associated with the circuit and a number of LEDs in the one or more LEDs 102. Moreover, in some examples, the K factor and the offset are each further defined as a function of temperature associated with the circuit, which can improve temperature-dependent operation of the circuit.

Figure 2:
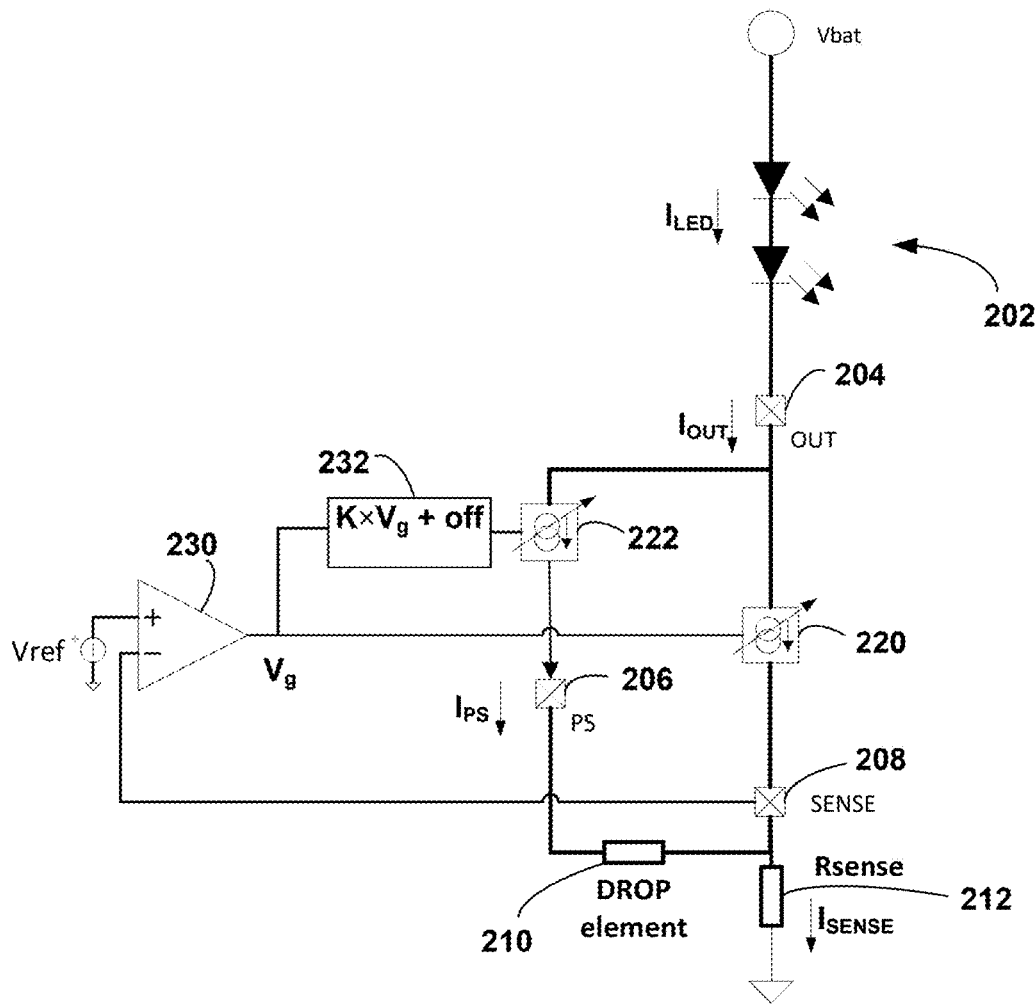
FIG. 2 is another circuit diagram of a system that includes a current regulator circuit configured to control one or more LEDs consistent with the teachings of this disclosure.

FIG. 2 is another example circuit consistent with this disclosure. FIG. 2 is similar to FIG. 1 in many respects and the structural elements of the circuit of FIG. 2 may be similar to those of FIG. 1, albeit arranged in a different manner. In general, LEDs 202 may be similar to LEDs 102 of FIG. 1. Output pin 204, power pin 206, and sense pin 208 may be similar to output pin 104, power pin 106, and sense pin 108. Drop element 210 may be similar to drop element 110, and sense resistor 212 may be similar to sense resister 112. Current sources 220 and 222 may be similar to current sources 120 and 122 and may comprise transistors as set forth above. Operational amplifier 230 may be similar to operational amplifier 130, and gain unit 232 may be similar to gain unit 132.

Like FIG. 1, as shown in FIG. 2, a circuit may be configured to deliver current to one or more LEDs 202. The circuit consistent with FIG. 2 may comprise a first current path configured to deliver a first current ($I_{OUT}$) to the one or more LEDs 102, and a second current path in parallel with the first current path, wherein the second current path is configured to deliver a second current ($I_{PS}$) through a voltage drop element 110 and to the one or more LEDs 102, wherein a sum of the first current and the second current is regulated based on a sensed current through the circuit. For example, a sense pin 108 may provide a sum of the first current and the second current to operational amplifier 130 to create a single control loop that is based on the sum of the first current ($I_{OUT}$) and the second current ($I_{PS}$).

In the example of FIG. 2, output pin 204 is positioned on a first supply side (e.g., the high side) of the first current path and the second current path, wherein output pin 204 is configured to be connected to the one or more LEDs 202. Power pin 206 is positioned on a second supply side (e.g., the low side) of the second current path, wherein power pin 206 is configured to be connected to voltage drop element 210, and wherein voltage drop element 210 is connected in series with a current sense resistor 212. A current sense pin 208 is positioned on the second supply side (e.g., the low side) of the first current path, wherein the current sense pin is configured to be connected to current sense resistor 212.

Similar to the example shown in FIG. 1, in FIG. 2, an operational amplifier 230 may be configured to generate a main control signal for regulating the first current path and the second current path based on the sensed current ($I_{SENSE}$). In this case, the sensed current comprises a summation of the first current ($I_{OUT}$) and the second current ($I_{PS}$).

As with the example of FIG. 1, in FIG. 2, the first current path may include a first transistor, e.g., represented in FIG. 2 as current source 220. The second current path may include a second transistor, e.g., represented in FIG. 2 as current source 222. Again, the first and second transistors may comprise BJTs or FETs, such as MOSFETS, as mentioned above. The main control signal may correspond to Vg, which defines a first control signal for the first transistor associated with current source 220. Gain unit 232 of the circuit may be configured to generate a second control signal for the second transistor associated with current source 222. Moreover, the second control signal may be a function of the main control signal. The first and second control signals, for example, may comprise gate control signals for MOSFETs or control signals to be applied to the base node of BJTs.

Again, in some examples, the second control signal is defined by an offset (off) added to a product of the main control signal (Vg) multiplied by a K factor. The K factor may be considered a linear gain applied relative to main control signal (Vg) and the offset (off) may be considered an offset gain that is further applied to the product of the main control signal multiplied by the K factor. In some examples, the K factor and the offset are each defined as a function of a supply voltage associated with the circuit. In some examples, the K factor and the offset are each defined as a function of a supply voltage associated with the circuit and a number of LEDs in the one or more LEDs 102. Moreover, in some examples, the K factor and the offset are each further defined as a function of temperature associated with the circuit, which can improve temperature-dependent operation of the circuit.

FIG. 3 is another example circuit consistent with this disclosure. FIG. 3 is similar to FIG. 1 in many respects and the structural elements of the circuit of FIG. 3 may be similar to those of FIG. 1, possibly with some additional elements. In general, LEDs 302 may be similar to LEDs 102 of FIG. 1. Output pin 304, power pin 306, and sense pin 308 may be similar to output pin 104, power pin 106, and sense pin 108. Drop element 310 may be similar to drop element 110, and sense resistor 312 may be similar to sense resister 112. Current sources 320 and 322 may be similar to current sources 120 and 122, and may comprise transistors as set forth above. Operational amplifier 330 may be similar to operational amplifier 130, and gain unit 323 may be similar to gain unit 132.

FIG. 3 is different from FIG. 1 insofar as FIG. 3 shows the possibility of additional current paths arranged in parallel, e.g., more than 2. This is shown by the illustration of <1:n> current paths and <1:m> drop elements. In this case, n refers to any number of current paths, e.g., 3 or more. Moreover, in this case, m refers to any number of drop elements, e.g., 2 or more.

Thus, consistent with FIG. 3, a circuit may include a third current path in parallel with the first current path and the regulated current path, wherein the third current paths is configured to deliver a third current through a second voltage drop element and the one or more LEDs, wherein the sum is a summation of the first current, second current, and the third current. More generally, a circuit may be configured to include N current paths in parallel, wherein N is apposi- tive integer greater than 1, wherein N−1 of the current paths are configured to be connected to voltage drop elements, wherein the sum is a summation of N currents associated with the N current paths.

In some cases, voltage drop element 110, 210, 310 may be external to the regulator circuit. Similarly, in some cases, current sense resistor 412 may be external to the regulator circuit. The one or more LEDs 102, 202, 302 are also external relative to the regulator circuit. The regulator cir- cuit, in some examples, may comprise the components of FIG. 1 that are arranged within pins 104, 106, 108, the components of FIG. 2 that are arranged within pins 204, 206, 208, or the components of FIG. 3 that are arranged within pins 304, 306, 308.

FIG. 4 is another example circuit consistent with this disclosure. FIG. 4 is similar to FIG. 2 in many respects and the structural elements of the circuit of FIG. 4 may be similar to those of FIG. 2, possibly with some additional elements. In general, LEDs 402 may be similar to LEDs 202 of FIG. 2. Output pin 404, power pin 406, and sense pin 408 may be similar to output pin 204, power pin 206, and sense pin 208. Drop element 410 may be similar to drop element 210, and sense resistor 412 may be similar to sense resister 212. Current sources 420 and 422 may be similar to current sources 220 and 222, and may comprise transistors as set forth above. Operational amplifier 430 may be similar to operational amplifier 230, and gain unit 423 may be similar to gain unit 232.

FIG. 4 is different from FIG. 2 insofar as FIG. 4 shows the possibility of additional current paths arranged in parallel, e.g., more than 2. This is shown by the illustration of <1:n> current paths and <1:m> drop elements. In this case, n refers to any number of current paths, e.g., 3 or more. Moreover, in this case, m refers to any number of drop elements, e.g., 2 or more.

Thus, consistent with FIG. 4, a circuit may include a third current path in parallel with the first current path and the regulated current path, wherein the third current paths is configured to deliver a third current through a second voltage drop element and the one or more LEDs, wherein the sum is a summation of the first current, second current, and the third current. More generally, a circuit may be configured to include N current paths in parallel, wherein N is apposi- tive integer greater than 1, wherein N−1 of the current paths are configured to be connected to voltage drop elements, wherein the sum is a summation of N currents associated with the N current paths.

FIG. 5 is another example circuit consistent with this disclosure. FIG. 5 is similar to FIG. 1 in many respects and the structural elements of the circuit of FIG. 5 may be similar to those of FIG. 1, albeit arranged in a different manner. In particular, whereas LEDs 102 and drop element 110 of FIG. 1 are located on a high side associated with a battery (Vbat), LEDs 502 and drop element 510 of FIG. 5 are located on a low side associated with a ground. Similarly, whereas sense resistor 112 of FIG. 1 is located on a low side associated with a ground, sense resistor 512 of FIG. 5 are located on a high side associated with a battery (Vbat).

In general, LEDs 502 may be similar to LEDs 102 of FIG. 1. Output pin 504, power pin 506, and sense pin 508 may be similar to output pin 104, power pin 106, and sense pin 108. Drop element 510 may be similar to drop element 110, and sense resistor 512 may be similar to sense resister 112. Current sources 520 and 522 may be similar to current sources 120 and 122, and may comprise transistors as set forth above. Operational amplifier 530 may be similar to operational amplifier 130, and gain unit 523 may be similar to gain unit 132.

Like FIG. 1, as shown in FIG. 5, a circuit may be configured to deliver current to one or more LEDs 502. The circuit consistent with FIG. 5 may comprise a first current path configured to deliver a first current ($I_{OUT}$) to the one or more LEDs 502, and a second current path in parallel with the first current path, wherein the second current path is configured to deliver a second current ($I_{PS}$) through a voltage drop element 510 and to the one or more LEDs 502, wherein a sum of the first current and the second current is regulated based on a sensed current through the circuit. For example, a sense pin 508 may provide a sum of the first current and the second current to operational amplifier 530 to create a single control loop that is based on the sum of the first current ($I_{OUT}$) and the second current ($I_{PS}$).

Again, whereas LEDs 102 and drop element 110 of FIG. 1 are located on a high side associated with a battery (Vbat), LEDs 502 and drop element 510 of FIG. 5 are located on a low side associated with a ground. Similarly, whereas sense resistor 112 of FIG. 1 is located on a low side associated with a ground, sense resistor 512 of FIG. 5 are located on a high side associated with a battery (Vbat). The high side associ- ated with the battery and the low side associated with the ground may be referred to herein as a first supply side (e.g., the high side) and a second supply side (e.g., the low side).

FIG. 5 is another example circuit consistent with this disclosure. FIG. 5 is similar to FIG. 1 in many respects and the structural elements of the circuit of FIG. 5 may be similar to those of FIG. 1, albeit arranged in a different manner. In particular, whereas LEDs 102 and drop element 110 of FIG. 1 are located on a high side associated with a battery (Vbat), LEDs 502 and drop element 510 of FIG. 5 are located on a low side associated with a ground. Similarly, whereas sense resistor 112 of FIG. 1 is located on a low side associated with a ground, sense resistor 512 of FIG. 5 are located on a high side associated with a battery (Vbat).

In general, LEDs 502 may be similar to LEDs 102 of FIG. 1. Output pin 504, power pin 506, and sense pin 508 may be similar to output pin 104, power pin 106, and sense pin 108. Drop element 510 may be similar to drop element 110, and sense resistor 512 may be similar to sense resister 112. Current sources 520 and 522 may be similar to current sources 120 and 122, and may comprise transistors as set forth above. Operational amplifier 530 may be similar to operational amplifier 130, and gain unit 523 may be similar to gain unit 132.

Like FIG. 1, as shown in FIG. 5, a circuit may be configured to deliver current to one or more LEDs 502. The circuit consistent with FIG. 5 may comprise a first current path configured to deliver a first current ($I_{OUT}$) to the one or more LEDs 502, and a second current path in parallel with the first current path, wherein the second current path is configured to deliver a second current ($I_{PS}$) through a voltage drop element 510 and to the one or more LEDs 502, wherein a sum of the first current and the second current is regulated based on a sensed current through the circuit. For example, a sense pin 508 may provide a sum of the first current and the second current to operational amplifier 530 to create a single control loop that is based on the sum of the first current ($I_{OUT}$) and the second current ($I_{PS}$).

Again, whereas LEDs 102 and drop element 110 of FIG. 1 are located on a high side associated with a battery (Vbat), LEDs 502 and drop element 510 of FIG. 5 are located on a low side associated with a ground. Similarly, whereas sense resistor 112 of FIG. 1 is located on a low side associated with a ground, sense resistor 512 of FIG. 5 are located on a high side associated with a battery (Vbat). The high side associated with the battery and the low side associated with the ground may be referred to herein as a first supply side (e.g., the high side) and a second supply side (e.g., the low side).

The principles of FIGS. 3 and 4, which show the possibility of additional current paths can also be used with the examples of FIGS. 5 and 6. That is, although FIGS. 5 and 6 each show two current paths and one drop element, N current paths and N–1 drop resistors could also be used consistent with the configurations shown in FIGS. 5 and 6, where N is a positive integer greater than 1. In other words, although FIGS. 5 and 6 each show regulator circuits with two current paths, a circuit consistent with FIG. 5 or 6 may be configured to include N current paths in parallel, wherein N is a positive integer greater than 1, wherein N–1 of the current paths are configured to be connected to voltage drop elements, wherein the sum used for the regulation loop is a summation of N currents associated with the N current paths.

Figure 7:
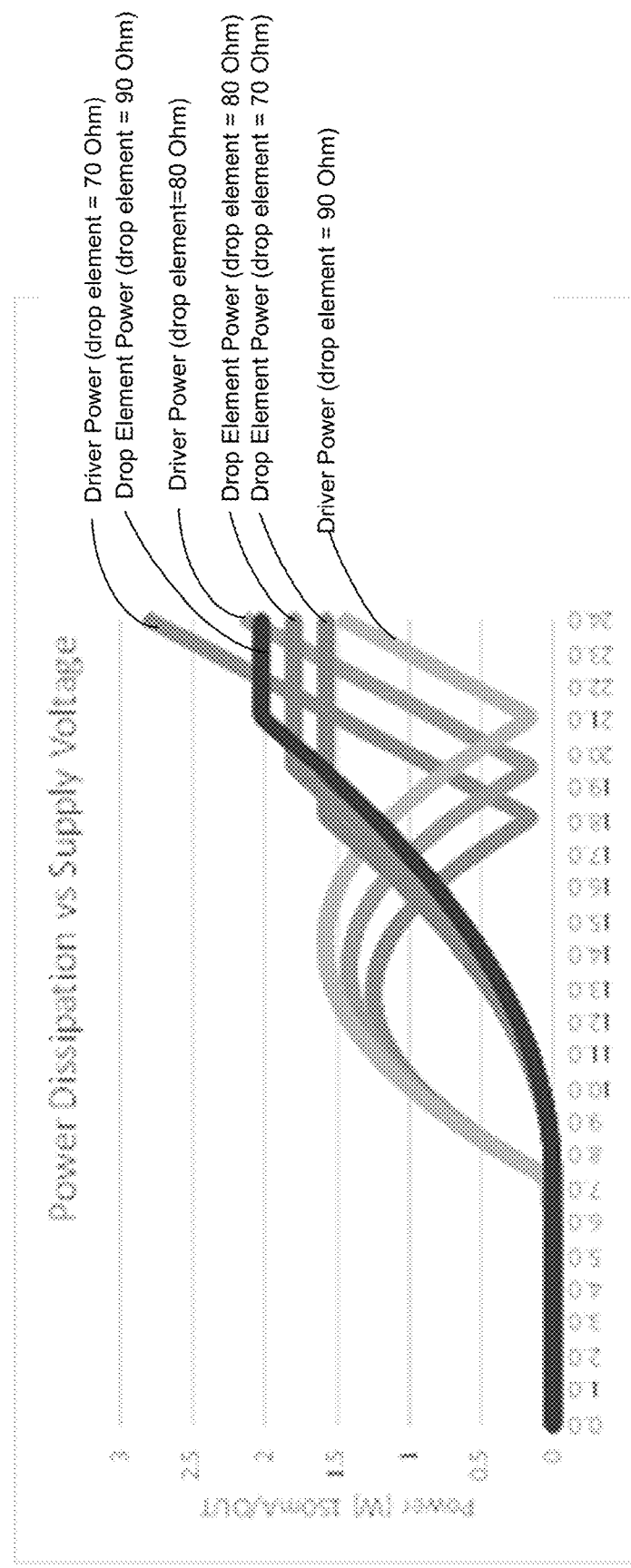
FIG. 7 is a graph showing power dissipation though an LED load and different drop elements as a function of supply voltage.

FIG. 7 is a graph showing power dissipation though an integrated circuit LED driver and power dissipation through different drop elements as a function of supply voltage, consistent with this disclosure. As shown in FIG. 7, for different drop elements, the power dissipation by the integrated circuit LED driver can be limited to less than 2 Watts over a desired range of supply voltages, e.g., between approximately 13 volts and 18 volts. In this range, at a given drop element, power dissipation by the integrated circuit LED driver drops as power dissipation by the drop element rises, which is desirable to help limit or control power dissipation inside the integrated circuit LED driver.

Figure 8:
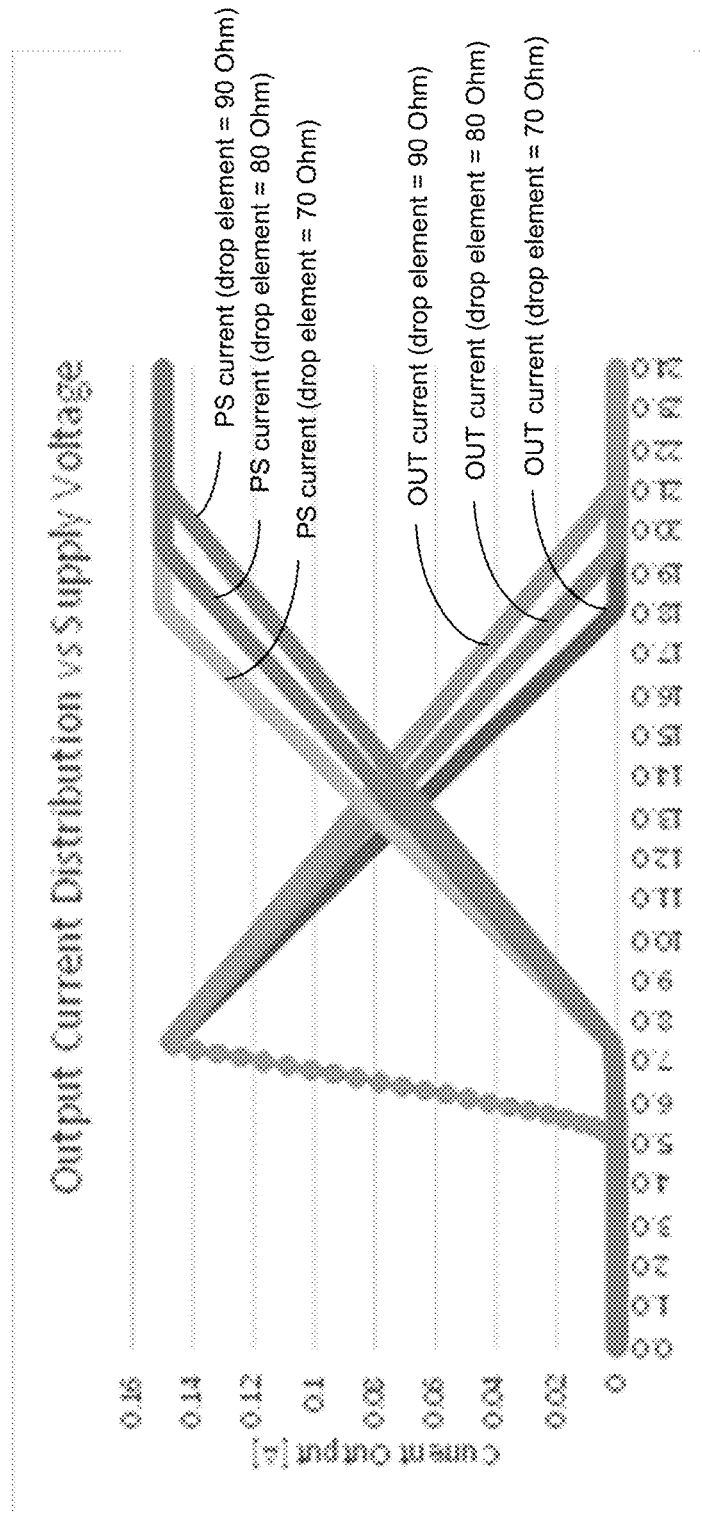
FIG. 8 is a graph showing output current distribution though an LED load and different drop elements as a function of supply voltage.

FIG. 8 is a graph showing output current distribution and power shift (PS) current distribution though different drop elements as a function of supply voltage, consistent with this disclosure. As shown, for different resistance values for the drop element, output current and power shift current paths through can be made to be complementary over a desired range of supply voltages, e.g., between approximately 7.5 volts and 18 volts. In this range, at a given drop element, current distributed to the output current path drops as current distributed to the drop element rises, which is desirable to help limit or control current through the integrated circuit LED driver, especially at higher supply voltages.

The circuits of this disclosure may provide two or more current output paths for each LED string. Current flows from a supply (e.g., from a battery or a ground) through LEDs into the driver circuit through an output pin and power pin associated with a power source, such as the battery or ground. In some cases, the OUT pin may be directly connected to the cathode of the final LED. The output may be connected to the same LED via an external drop element (e.g. a high-power resistor). Placing the drop element external to the driver may help reduce driver self-heating.

According to this disclosure, the regulator control loop, without the need of any additional sensing of current over the drop element, can dynamically adjusts the output currents on both OUT and PS in order to regulate the total amount desired LED current:

$$I_{LED}=I_{OUT}+I_{PS}$$

The summed current of OUT and PS is equal to the current through the $R_{SENSE}$ resistor, which may be set by a user to define the LED current:

$$I_{LED}=I_{SENSE}$$

In order to define the SENSE output current, an accurate internal (or external) $V_{REF}$ voltage reference can be maintained stable by the driver control loop on the SENSE pin:

$$I_{SENSE}=V_{REF}/R_{SENSE}$$

Again, a single control loop can be regulated based on a reference voltage Vref in order to dynamically adjust the output currents on both OUT and PS in order to regulate the total amount desired LED current. Vref may be fixed or programmable. If Vref is fixed, the Vref may be based on a known voltage, such as that associated with Vbat or something that is generated as a function of Vbat or other known voltage. Moreover, in some examples, Vref can even be changed or adapted, e.g., to adjust light output by the LEDs, or create effects, to create modulation in the control signals, to provide analog dimming, or for other reasons.

At low supply voltages, a constant K factor gain (e.g., higher than one) connected in series to the power source (PS) power stage, allows the circuit to drive LEDs in the triode region while the OUT power stage is saturated. In the opposite case, when the supply voltage is high, the PS power stage works in saturation region while the OUT is close to its cut-off region.

As a result, with the circuits of this disclosure, when the voltage difference between Vbat supply and LED required drop voltage is relatively high, the main part of the LED current flows through the PS pin, e.g., the power pin configured to be connected to a drop element. In the alternative, when the headroom between Vbat supply and LED required drop voltage is quite low, the majority of the LED current flows through the OUT pin, e.g., the output pin configured to be connected to the LEDs. FIGS. 7 and 8 show an example of integrated circuit power dissipation and current curves vs supply voltage at different values of $R_{SENSE}$ resistor by considering three LED load string and a three 150 mA channel device.

According to this disclosure, in some examples, the power distribution between the outputs is defined in an adaptive way directly by the system boundary conditions (i.e., battery voltage, consumer load drop voltage and the offload resistor size).

FIG. 9 is an example flow diagram showing one or more aspects of this disclosure. The method of FIG. 9 may be performed by circuits shown in any of FIGS. 1-6. FIG. 9 generally shows a method of operating a current a current regulator circuit for driving one or more LEDs. The method comprises regulating a first current path through the current regulator circuit based on a sensed current through the current regulator circuit (901). The regulation, for example, may be based on a sensed current that comprises a sum of a first portion of output current and a second portion of output current.

For example, as described above, the first current path may be configured to deliver a first portion of output current to the one or more LEDs based on a sensed current through the current regulator circuit. The method further comprises regulating a second current path through the current regulator circuit based on the same sensed current through the current regulator circuit, wherein the second current path is in parallel with the first current path, and wherein the second current path is configured to pass through a drop element to reduce power dissipation within the current regulator circuit (902). For example, the second current path may be configured to deliver a second portion of the output current to the one or more light emitting diodes. The sensed current through the current regulator circuit comprises a summation of the first portion of output current and the second portion of output current. Thus, a single regulation loop may regulate both the first and second current paths based on a sensed current that comprises a summation of currents in the first and second current paths.

In more general terms and consistent with the method shown in FIG. 9, the method may further include regulating N current paths in parallel, wherein N is appositive integer greater than 1. In this case, N−1 of the current paths may be configured to be connected to voltage drop elements, and the sum may comprise a summation of N currents associated with the N current paths.

The following clauses may illustrate one or more aspects of the disclosure.

Clause 1—A circuit configured to deliver current to one or more LEDs, the circuit comprising: a first current path configured to deliver a first current to the one or more LEDs; and a second current path in parallel with the first current path, wherein the second current path is configured to deliver a second current through a voltage drop element and to the one or more LEDs, wherein a sum of the first current and the second current is regulated based on a sensed current through the circuit.

Clause 2—The circuit of clause 1, further comprising: an output pin positioned on a first supply side of the first current path, wherein the output pin is configured to be connected to the one or more LEDs; a power pin positioned on the first supply side of the second current path, wherein the power pin is configured to be connected to the voltage drop element, wherein the voltage drop element is connected in series with the one or more LEDs; and a current sense pin positioned on a second supply side of the first current path and the second supply side of the second current path, wherein the current sense pin is configured to be connected to a current sense resistor.

Clause 3—The circuit of clause 1 or 2, further comprising: an operational amplifier configured to generate a main control signal for regulating the first current path and the second current path based on the sensed current.

Clause 4—The circuit of clause 3, wherein the first current path includes a first transistor, wherein the second current path includes a second transistor, wherein the main control signal defines a first control signal for the first transistor, and wherein the circuit is configured to generate a second control signal for the second transistor as a function of the main control signal.

Clause 5—The circuit of clause 4, wherein the second control signal is defined by an offset added to a product of the main control signal multiplied by a K factor.

Clause 6—The circuit of clause 5, wherein the K factor and the offset are each defined as a function of a supply voltage associated with the circuit.

Clause 7—The circuit of clause 5 or 6, wherein the K factor and the offset are each defined as a function of a supply voltage associated with the circuit and a number of LEDs in the one or more LEDs.

Clause 8—The circuit of any of clauses 5-7, wherein the K factor and the offset are each further defined as a function of temperature associated with the circuit.

Clause 9—The circuit of clause 1, further comprising: an output pin positioned on a first supply side of the first current path and the second current path, wherein the output pin is configured to be connected to the one or more LEDs; a power pin positioned on a second supply side of the second current path, wherein the power pin is configured to be connected to the voltage drop element, wherein the voltage drop element is connected in series with a current sense resistor; and a current sense pin positioned on second supply side of the first current path, wherein the current sense pin is configured to be connected to the current sense resistor.

Clause 10—The circuit of clause 8 or 9, further comprising: an operational amplifier configured to generate a main control signal for regulating the first current path and the second current path based on the sensed current.

Clause 11—The circuit of clause 10, wherein the first current path includes a first transistor, wherein the second current path includes a second transistor, wherein the main control signal defines a first control signal for the first transistor, and wherein the circuit is configured to generate a second control signal for the second transistor as a function of the main control signal.

Clause 12—The circuit of clause 11, wherein the second control signal is defined by an offset added to a product of the main control signal multiplied by a K factor.

Clause 13—The circuit of clause 12, wherein the K factor and the offset are each defined as a function of a supply voltage associated with the circuit.

Clause 14—The circuit of clause 12 or 13, wherein the K factor and the offset are each is defined as a function of a supply voltage associated with the circuit and a number of LEDs in the one or more LEDs.

Clause 15—The circuit of any of clauses 12-14, wherein the K factor and the offset are each further defined as a function of temperature associated with the circuit.

Clause 16—The circuit of any of clauses 1-15, further comprising: a third current path in parallel with the first current path and the regulated current path, wherein the third current paths is configured to deliver a third current through a second voltage drop element and the one or more LEDs, wherein the sum is a summation of the first current, second current, and the third current.

Clause 17—The circuit of any of clauses 1-17, further comprising: N current paths in parallel, wherein N is appositive integer greater than 1, wherein N−1 of the current paths are configured to be connected to voltage drop elements, wherein the sum is a summation of N currents associated with the N current paths.

Clause 18—The circuit of any of clauses 1-18, further comprising: the voltage drop element; the one or more LEDs; and a current sense resistor.

Clause 19—A method of operating a current regulator circuit for driving one or more LEDs, the method comprising: regulating a first current path through the current regulator circuit based on a sensed current through the current regulator circuit, wherein the first current path is configured to deliver a first portion of output current to the one or more LEDs based on a sensed current through the current regulator circuit; and regulating a second current path through the current regulator circuit based on the sensed current through the current regulator circuit, wherein the second current path is in parallel with the first current path, wherein the second current path is configured to deliver a second portion of the output current to the one or more light emitting diodes, wherein the sensed current through the current regulator circuit comprises a sum of the first portion of output current and the second portion of output current, and wherein the second portion of the current is further configured to pass through a drop element to reduce power dissipation within the current regulator circuit.

Clause 20—The method of clause 19, further comprising: regulating N current paths in parallel, wherein N is appositive integer greater than 1, wherein N−1 of the current paths are configured to be connected to voltage drop elements, wherein the sum is a summation of N currents associated with the N current paths.

Various aspects have been described in this disclosure. These and other aspects are within the scope of the following claims.

The invention claimed is:

1. A circuit configured to deliver current to one or more light emitting diodes (LEDs), the circuit comprising:
    a first current path configured to deliver a first current to the one or more LEDs;
    a second current path in parallel with the first current path, wherein the second current path is configured to deliver a second current through a voltage drop element and to the one or more LEDs, wherein a sum of the first current and the second current is regulated based on a sensed current through the circuit;
    an output pin positioned on a first supply side of the first current path, wherein the output pin is configured to be connected to the one or more LEDs;
    a power pin positioned on the first supply side of the second current path, wherein the power pin is configured to be connected to the voltage drop element, wherein the voltage drop element is connected in series with the one or more LEDs; and
    a current sense pin positioned on a second supply side of the first current path and the second supply side of the second current path, wherein the current sense pin is configured to be connected to a current sense resistor.

2. The circuit of claim 1, further comprising:
    an operational amplifier configured to generate a main control signal for regulating the first current path and the second current path based on the sensed current.

3. The circuit of claim 2,
    wherein the first current path includes a first transistor,
    wherein the second current path includes a second transistor,
    wherein the main control signal defines a first control signal for the first transistor, and
    wherein the circuit is configured to generate a second control signal for the second transistor as a function of the main control signal.

4. The circuit of claim 3, wherein the second control signal is defined by an offset added to a product of the main control signal multiplied by a K factor.

5. The circuit of claim 4, wherein the K factor and the offset are each defined as a function of a supply voltage associated with the circuit.

6. The circuit of claim 4, wherein the K factor and the offset are each defined as a function of a supply voltage associated with the circuit and a number of LEDs in the one or more LEDs.

7. The circuit of claim 6, wherein the K factor and the offset are each further defined as a function of temperature associated with the circuit.

8. The circuit of claim 1, further comprising:
    a third current path in parallel with the first current path and the regulated current path, wherein the third current paths is configured to deliver a third current through a second voltage drop element and the one or more LEDs, wherein the sum is a summation of the first current, second current, and the third current.

9. The circuit of claim 1, further comprising:
    N current paths in parallel, wherein N is appositive integer greater than 1,
    wherein N−1 of the current paths are configured to be connected to voltage drop elements, wherein the sum is a summation of N currents associated with the N current paths.

10. The circuit of claim 1, further comprising:
    the voltage drop element;
    the one or more LEDs; and
    the current sense resistor.

11. A circuit configured to deliver current to one or more light emitting diodes (LEDs), the circuit comprising:
    a first current path configured to deliver a first current to the one or more LEDs;
    a second current path in parallel with the first current path, wherein the second current path is configured to deliver a second current through a voltage drop element and to the one or more LEDs, wherein a sum of the first current and the second current is regulated based on a sensed current through the circuit;
    an output pin positioned on a first supply side of the first current path and the second current path, wherein the output pin is configured to be connected to the one or more LEDs;
    a power pin positioned on a second supply side of the second current path, wherein the power pin is configured to be connected to the voltage drop element, wherein the voltage drop element is connected in series with a current sense resistor; and
    a current sense pin positioned on second supply side of the first current path, wherein the current sense pin is configured to be connected to the current sense resistor.

12. The circuit of claim 11, further comprising:
    an operational amplifier configured to generate a main control signal for regulating the first current path and the second current path based on the sensed current.

13. The circuit of claim 12,
    wherein the first current path includes a first transistor,
    wherein the second current path includes a second transistor,
    wherein the main control signal defines a first control signal for the first transistor, and
    wherein the circuit is configured to generate a second control signal for the second transistor as a function of the main control signal.

14. The circuit of claim 13, wherein the second control signal is defined by an offset added to a product of the main control signal multiplied by a K factor.

15. The circuit of claim 14, wherein the K factor and the offset are each defined as a function of a supply voltage associated with the circuit.

16. The circuit of claim 14, wherein the K factor and the offset are each is defined as a function of a supply voltage associated with the circuit and a number of LEDs in the one or more LEDs.

17. The circuit of claim 16, wherein the K factor and the offset are each further defined as a function of temperature associated with the circuit.

18. The circuit of claim 11, further comprising:
a third current path in parallel with the first current path and the regulated current path, wherein the third current paths is configured to deliver a third current through a second voltage drop element and the one or more LEDs, wherein the sum is a summation of the first current, second current, and the third current.

19. The circuit of claim 11, further comprising:
N current paths in parallel, wherein N is appositive integer greater than 1,
wherein N-1 of the current paths are configured to be connected to voltage drop elements, wherein the sum is a summation of N currents associated with the N current paths.

20. The circuit of claim 11, further comprising:
the voltage drop element;
the one or more LEDs; and
the current sense resistor.

* * * * *